: 
United States Patent
Sharon et al.

(10) Patent No.: US 10,409,676 B1
(45) Date of Patent: Sep. 10, 2019

(54) SRAM BIT-FLIP PROTECTION WITH REDUCED OVERHEAD

(71) Applicant: Western Digital Technologies, Inc., San Jose, CA (US)

(72) Inventors: Eran Sharon, Rishon Lezion (IL); Ariel Navon, Revava (IL); Shay Benisty, Beer Sheva (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/899,948

(22) Filed: Feb. 20, 2018

(51) Int. Cl.
| | |
|---|---|
| G11C 29/00 | (2006.01) |
| G06F 11/10 | (2006.01) |
| H03M 13/19 | (2006.01) |
| G11C 29/52 | (2006.01) |
| G11C 11/412 | (2006.01) |

(52) U.S. Cl.
CPC .......... *G06F 11/1068* (2013.01); *G11C 29/52* (2013.01); *H03M 13/19* (2013.01); *G11C 11/412* (2013.01)

(58) Field of Classification Search
CPC .... G06F 11/1068; H03M 13/19; G11C 29/52; G11C 11/412
See application file for complete search history.

(56) References Cited

U.S. PATENT DOCUMENTS

| | | | |
|---|---|---|---|
| 2017/0091025 A1* | 3/2017 | Ahn | G06F 3/0619 |
| 2017/0308299 A1* | 10/2017 | Cha | G11C 11/161 |

* cited by examiner

*Primary Examiner* — Samir W Rizk
(74) *Attorney, Agent, or Firm* — Vierra Magen Marcus LLP

(57) ABSTRACT

Systems and methods for efficiently implementing data protection techniques that protect data stored in volatile and non-volatile memory devices from soft errors are described. The error correction overprovisioning for a plurality of memory banks may be reduced by implementing localized single-bit error parity to detect single-bit errors within each memory bank of the plurality of memory banks and then sharing a single-error correcting parity or a single-error correcting and double-error detecting parity (SECDEC) over multiple memory banks or over all of the plurality of memory banks. The single-error correcting code (e.g., a Hamming code) may be generated and shared over the plurality of memory banks such that the single-error correcting code may correct single-bit errors across multiple sets of data stored within the plurality of memory banks that correspond with a particular line or row across all of the plurality of memory banks.

20 Claims, 19 Drawing Sheets

SRAM BIT-FLIP PROTECTION WITH REDUCED OVERHEAD

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PCM). In recent years, both volatile and non-volatile memory devices have been scaled in order to reduce the cost per bit. However, as process geometries shrink, many design and process challenges are presented. These challenges include increased variability in memory cell I-V characteristics over process, voltage, and temperature variations and increased susceptibility to chip-level soft errors.

DETAILED DESCRIPTION

Figure 1A:
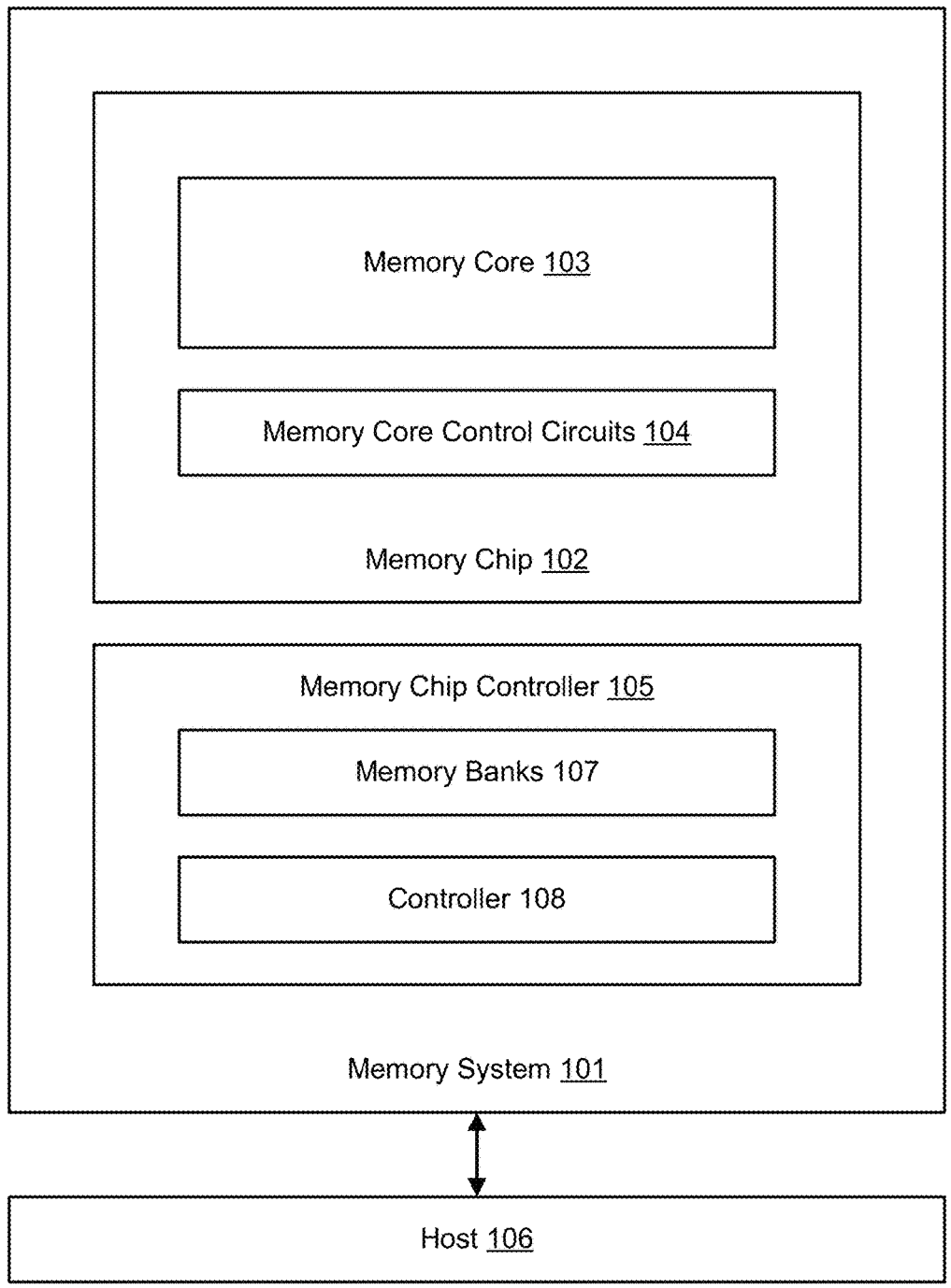
FIGS. 1A-1F depict various embodiments of a memory system.

Technology is described for efficiently implementing data protection techniques that protect data stored in volatile and non-volatile memory devices from soft errors. The soft errors may appear as random bit errors and be caused by alpha particles emitted from chip packaging materials (e.g., from lead-based isotopes in the solder bumps of a flip-chip package) or from cosmic radiation. In some cases, the error correction overprovisioning or the overhead of storing redundant data for detecting and correcting against data errors may be reduced by implementing localized single-bit error parity to detect single-bit errors within each memory bank of a plurality of memory banks and then sharing a single-error correcting parity or a single-error correcting and double-error detecting parity (SECDEC) over multiple memory banks or over all of the plurality of memory banks. Each line or row within a memory bank of the plurality of memory banks may store a set of data bits (e.g., 64 bits of data or 128 bits of data) and a single local parity bit for the set of data bits in order to detect single-bit errors occurring within the set of data bits. A single-error correcting code (e.g., a Hamming code or an extended Hamming code) may be generated and shared over the plurality of memory banks such that the single-error correcting code may correct single-bit errors across multiple sets of data stored within the plurality of memory banks that correspond with a particular line or row across all of the plurality of memory banks. The single-error correcting code may be written to a location within a dedicated shared memory bank corresponding with the particular line or row. The dedicated shared memory bank may be on the same integrated circuit as the plurality of memory banks or may be located on a different integrated circuit (e.g., using an external DRAM) than the plurality of memory banks. One benefit of storing the single-error correcting code off-chip is that the die area of a memory die including the plurality of memory banks may be reduced while maintaining the ability to correct single-bit errors.

Upon detection of a single-bit error corresponding with data within a line or row of a first memory bank of the plurality of memory banks (e.g., during a read operation or a read before write operation to the memory banks), the single-error correcting code for the line or row may be read from the dedicated shared memory bank and the multiple sets of data corresponding with the line or row may be read from the plurality of memory banks in order to identify the location of the single-bit error. The single-error correcting code may be used to identify and correct the single-bit error within the data corresponding with the line or row of the first memory bank. The data corresponding with the line or row of the first memory bank may be stored within memory cells connected to a common word line within the first memory bank. The first memory bank may comprise SRAM memory cells, DRAM memory cells, ReRAM memory cells, PCM memory cells, or Flash-based memory cells (e.g., NAND Flash memory cells). In some cases, small granularity read operations (e.g., reading 32 bits or 64 bits corresponding with a line of the first memory bank) may be performed and larger granularity write operations (e.g., writing all 64 bits across 16 different memory banks) may be performed in order to reduce the read before write burden of needing to read data from other memory banks of the plurality of memory banks before writing data to the first memory bank. For memory banks that store a relatively small number of bits per line, the reduction in the overhead for storing the error correcting codes for detecting and correcting against data errors may be significantly reduced. For example, for an implementation with 16 memory banks with 64-bit data widths, the overprovisioning may be reduced from 12.5% (e.g., implementing a [72,64] Hamming code per memory bank) to 2.3%.

An error correcting code may utilize a set of parity check bits that are generated and stored along with multiple sets of data that have been written across a line or row of one or more memory banks. Each parity check bit may comprise a parity bit for a particular grouping of data bits across the line or row of the one or more memory banks. In some cases, one of the parity check bits may comprise an XORing of a number of different data bits across the line or row of the one or more memory banks. The set of parity check bits may correspond with a single-bit error correcting code that may be added to or appended to the multiple sets of data in order to correct single-bit errors occurring to the multiple sets of data. The total number of parity check bits required may comprise the ceiling of log base 2 (N) plus one (i.e., ceil($\log_2$(N))+1), where N is the total number of data bits to be protected across the line or row within the one or more memory banks. In one example, if the total number of bits stored across the line or row of the one or more memory banks comprises eight total data bits, then four parity check bits may be generated and stored with the eight data bits to protect against single-bit errors. In the case that a Hamming code is used to generate the four parity check bits and protect the four parity bits and the eight data bits (e.g., 12 total bits from bit 1 to bit 12 in which bit positions numbered with powers of two are reserved for the parity check bits), then a first parity check bit for bit position one may comprise the XORing of bits 3, 5, 7, 9, and 11, a second parity check bit for bit position two may comprise the XORing of bits 3, 6, 7, 10, and 11, a third parity check bit for bit position four may comprise the XORing of bits 5, 6, 7, and 12, and a fourth parity check bit for bit position eight may comprise the XORing of bits 9, 10, 11, and 12. The four parity check bits may be stored within using a dedicated shared memory bank in a location corresponding with the line or row of the one or more memory banks.

In some cases, the plurality of memory banks may be arranged on a first integrated circuit or a first memory die (e.g., a NAND Flash memory die) and the dedicated shared memory bank may also be arranged on the same first integrated circuit or the same first memory die as the plurality of memory banks. In other cases, the plurality of memory banks may be arranged on a first integrated circuit or a first memory die and the dedicated shared memory bank may be arranged on a second integrated circuit or a second memory die. In one example, the dedicated shared memory bank may comprise a DRAM or a Flash-based memory bank while the plurality of memory banks may comprise SRAM memory banks.

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106.

As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more memory banks 107 (e.g., 16 SRAM memory banks) and controller 108 (e.g., comprising one or more state machines and control circuitry) for controlling the operation of memory chip 102 and/or for controlling the reading of data from the memory banks 107 and the writing of data to the memory banks 107. The one or more state machines, page registers, SRAM, and control circuitry within the memory chip controller 105 for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
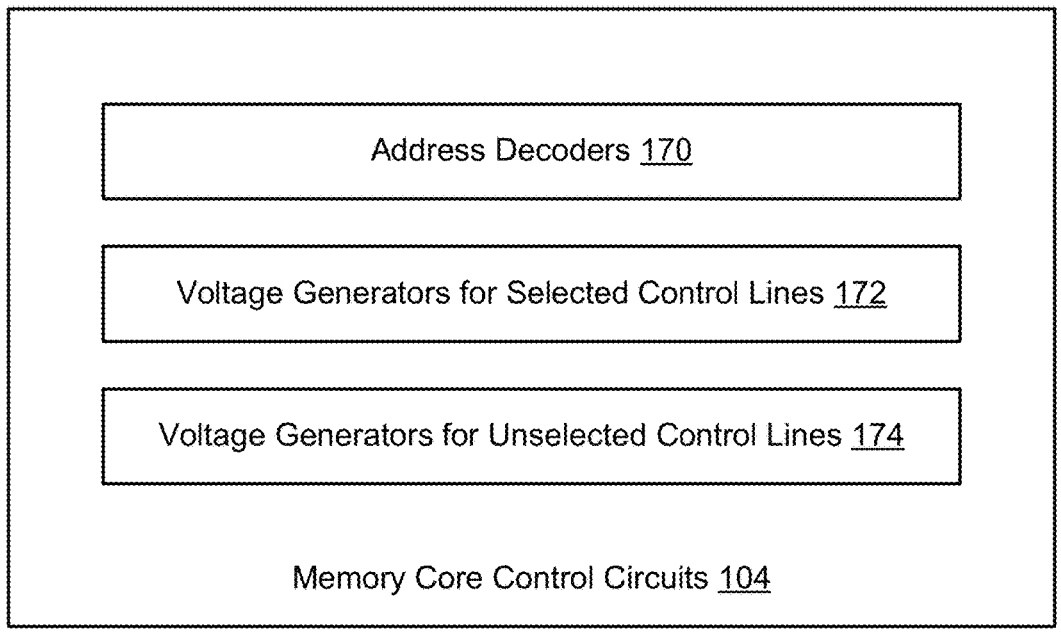

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
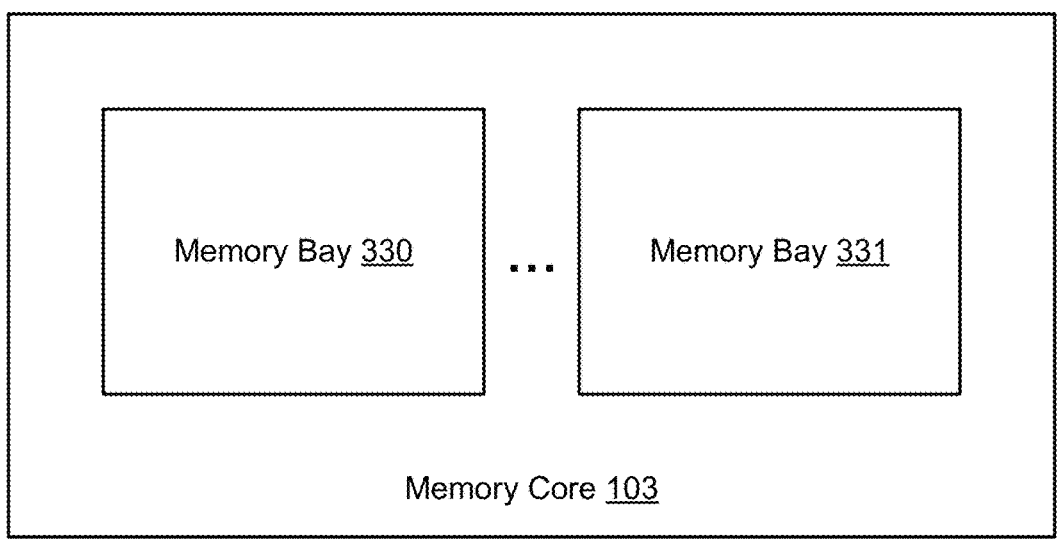

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays or 256 memory bays).

Figure 1D:
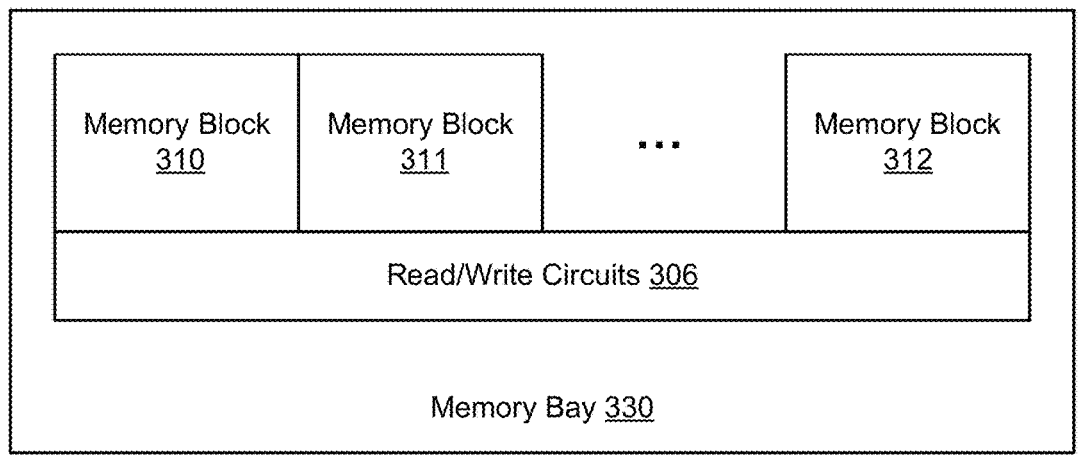

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 306 may be used to program a particular memory cell to be in one of three or more data/resistance states (i.e., the particular memory cell may comprise a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
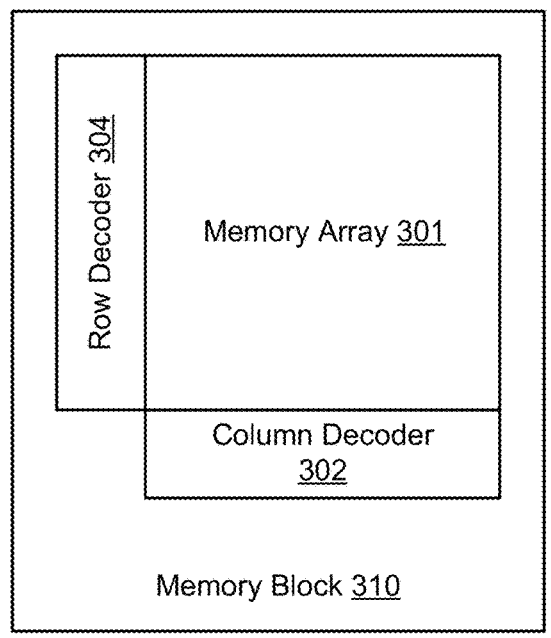

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
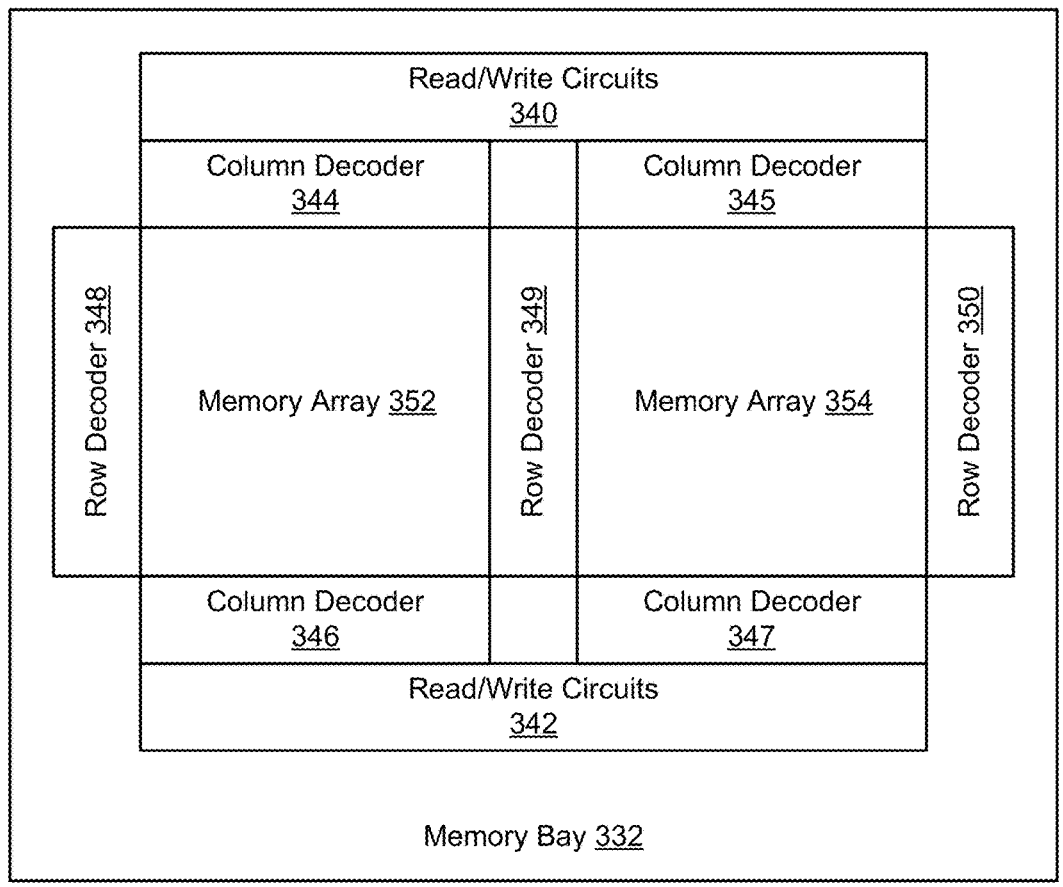

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

Figure 2A:
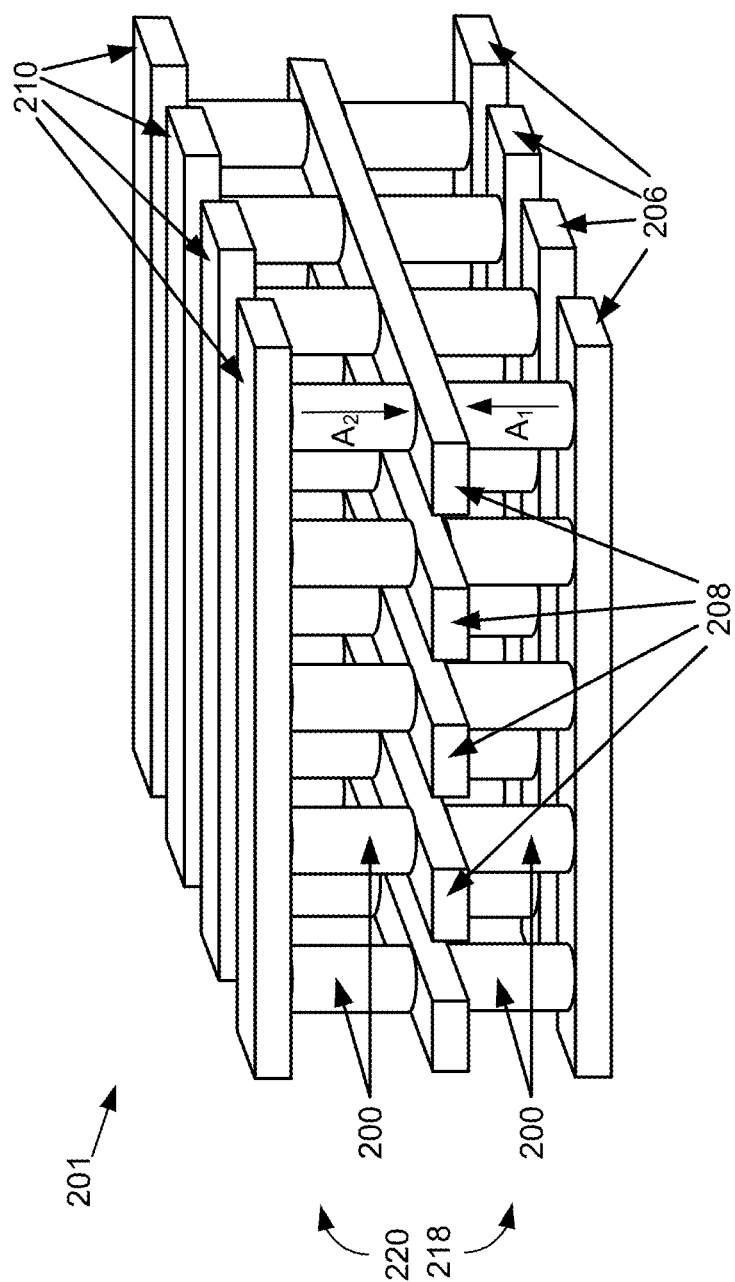
FIGS. 2A-2B depict various embodiments of a portion of a three-dimensional memory array.

FIG. 2A depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow A2 (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

In one embodiment, the memory cells 200 of FIG. 2A may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 2A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 2A, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 2A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1." In some embodiments, a higher than normal programming voltage may be required the first time a reversible resistance-switching element is SET into the low-resistivity state as the reversible resistance-switching element may have been placed into a resistance state that is higher than the high-resistivity state when fabricated. The term "FORMING" may refer to the setting of a reversible resistance-switching element into a low-resistivity state for the first time after fabrication or the resetting of a reversible resistance-switching element into a high-resistivity state for the first time after fabrication. In some cases, after a FORMING operation or a memory cell preconditioning operation has been performed, the reversible resistance-switching element may be RESET to the high-resistivity state and then SET again to the low-resistivity state.

Referring to FIG. 2A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 2B:
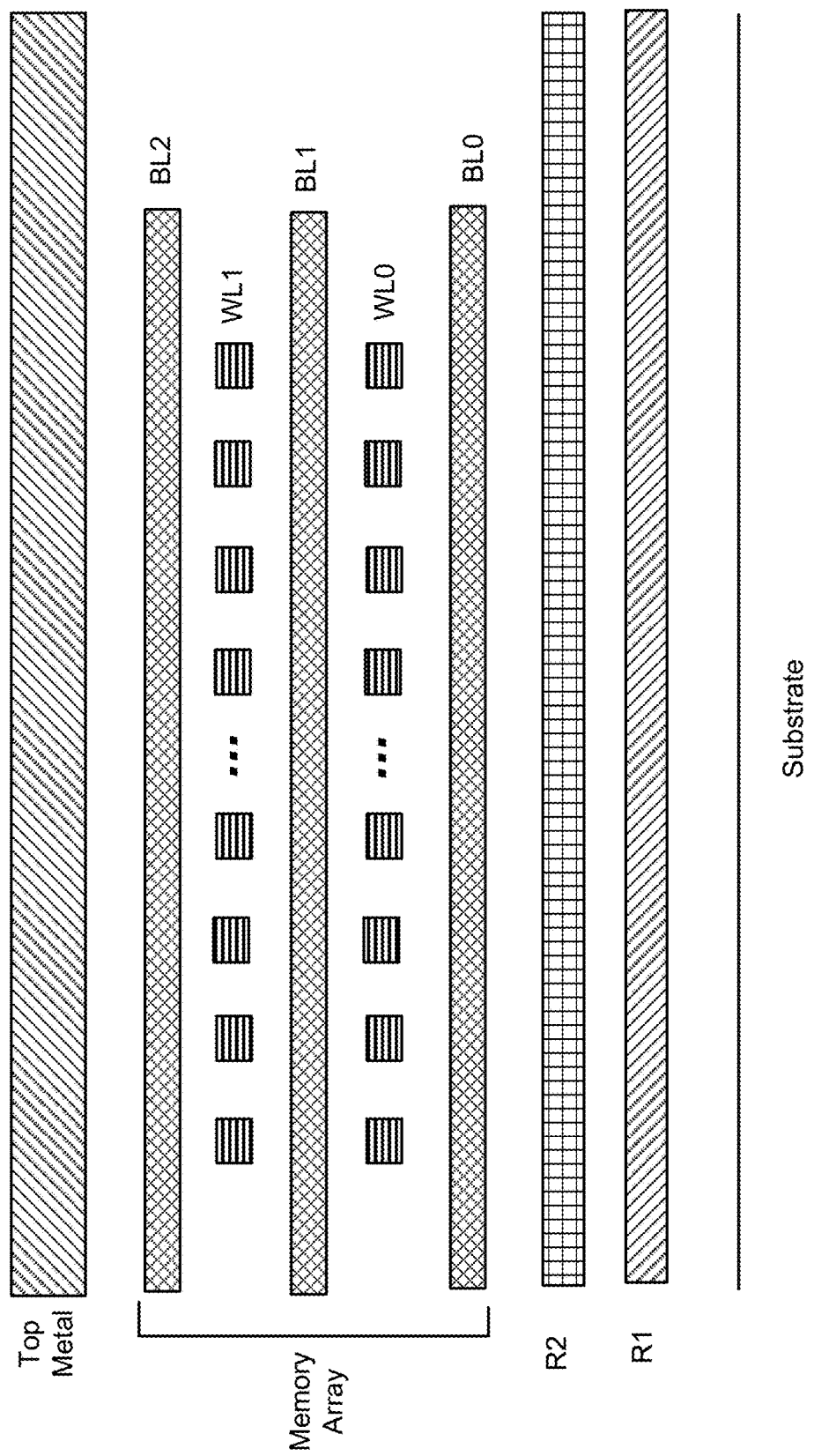

FIG. 2B depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 2B, two metal layers R1 and R2 may be used for routing layers; however, other embodiments can include more or less than two metal layers. In one example, these metal layers R1 and R2 may be formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 3A:
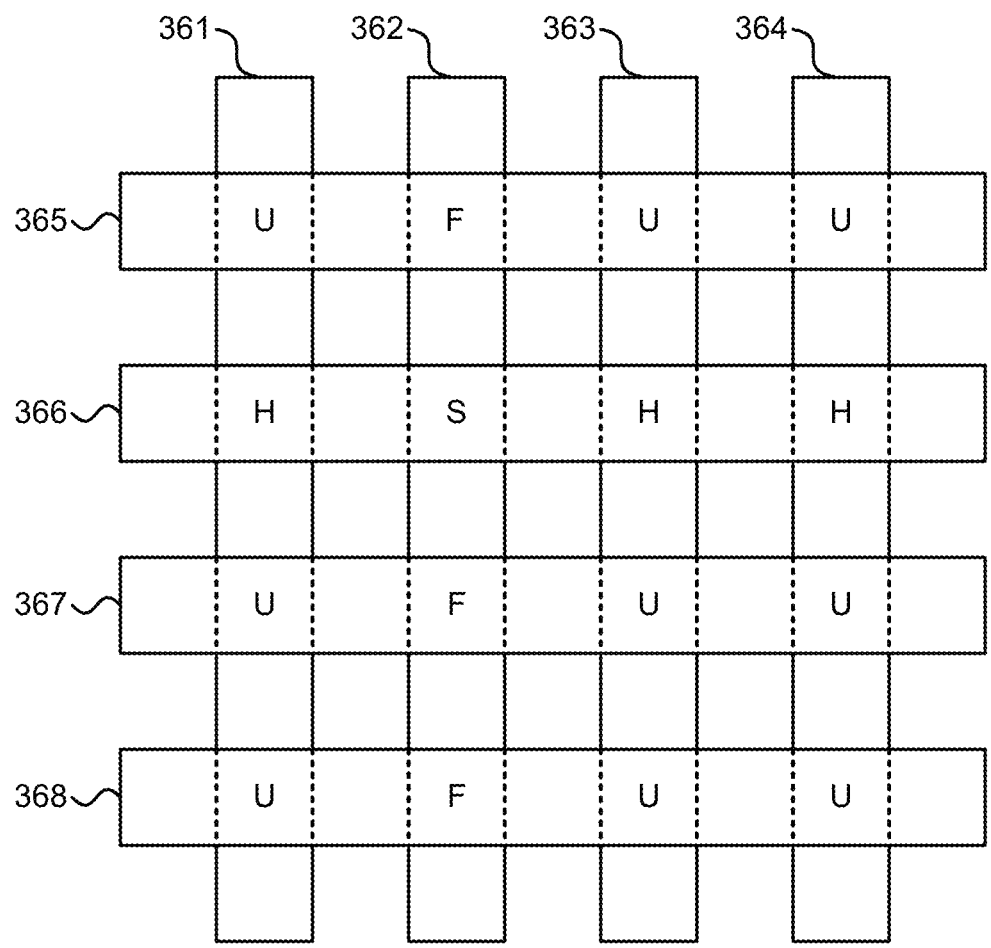
FIGS. 3A-3B depict embodiments of a cross-point memory array.

FIG. 3A depicts one embodiment of a cross-point memory array 360. In one example, the cross-point memory array 360 may correspond with memory array 201 in FIG. 2A. As depicted, cross-point memory array 360 includes word lines 365-368 and bit lines 361-364. The bit lines 361 may comprise vertical bit lines or horizontal bit lines. Word line 366 comprises a selected word line and bit line 362 comprises a selected bit line. At the intersection of selected word line 366 and selected bit line 362 is a selected memory cell (an S cell). The voltage across the S cell is the difference between the selected word line voltage and the selected bit line voltage. Memory cells at the intersections of the selected word line 366 and the unselected bit lines 361, 363, and 364 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 362 and the unselected word lines 365, 367, and 368 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 365, 367, and 368 and the unselected bit lines 361, 363, and 364 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 365, may be associated with a particular page stored within the cross-point memory array 360.

Figure 3B:
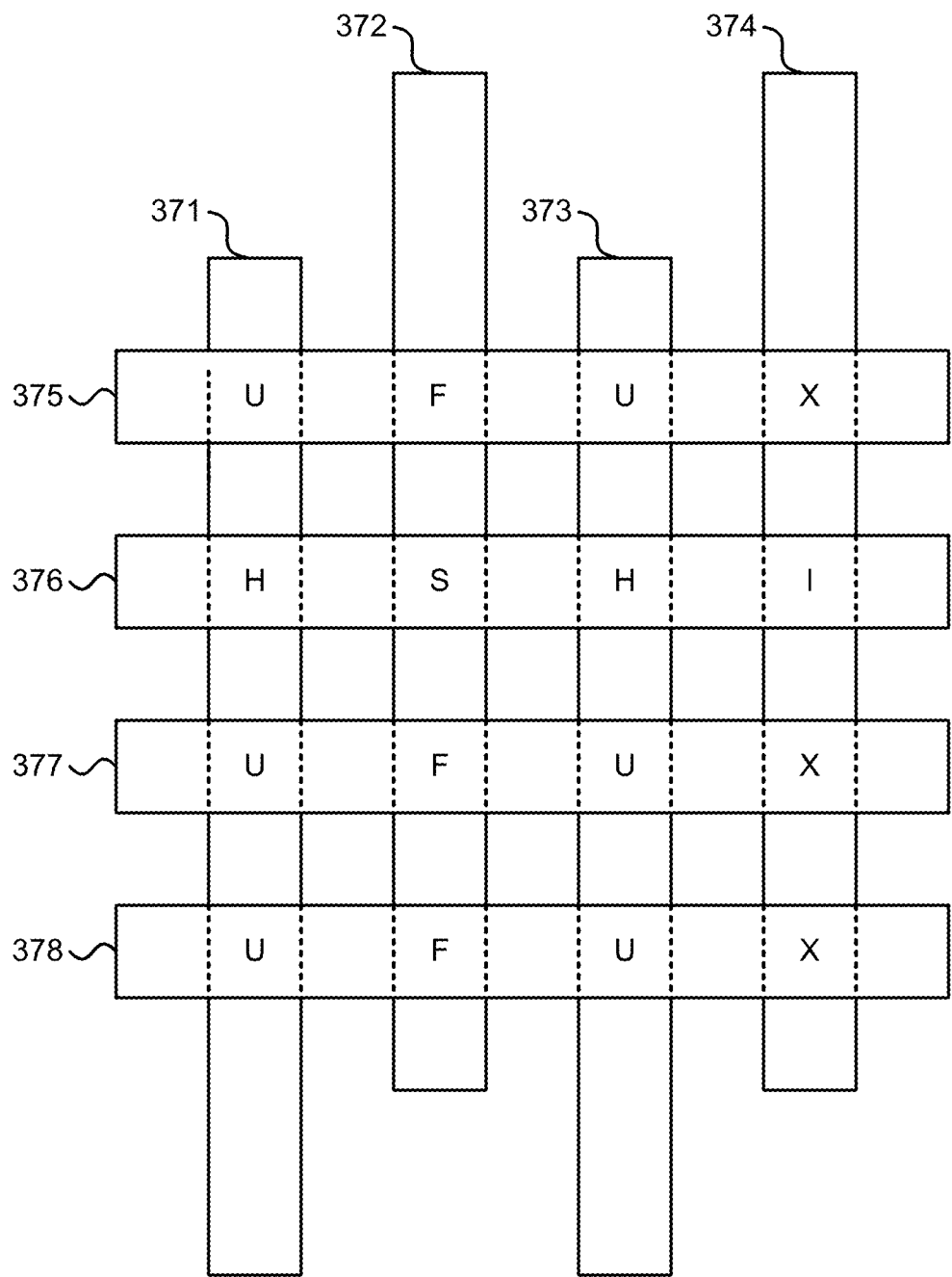

FIG. 3B depicts an alternative embodiment of a cross-point memory array 370. In one example, the cross-point memory array 370 may correspond with memory array 201 in FIG. 2A. As depicted, cross-point memory array 370 includes word lines 375-378 and bit lines 371-374. The bit lines 361 may comprise vertical bit lines or horizontal bit lines. Word line 376 comprises a selected word line and bit lines 372 and 374 comprise selected bit lines. Although both bit lines 372 and 374 are selected, the voltages applied to bit line 372 and bit line 374 may be different. For example, in the case that bit line 372 is associated with a first memory cell to be programmed (i.e., an S cell), then bit line 372 may be biased to a selected bit line voltage in order to program the first memory cell. In the case that bit line 374 is associated with a second memory cell that is not to be programmed (i.e., an I cell), then bit line 374 may be biased to a program inhibit voltage (i.e., to a bit line voltage that will prevent the second memory cell from being programmed).

At the intersection of selected word line 376 and selected bit line 374 is a program inhibited memory cell (an I cell). The voltage across the I cell is the difference between the selected word line voltage and the program inhibit voltage. Memory cells at the intersections of the selected bit line 374 and the unselected word lines 375, 377, and 378 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 374 may be the same as or substantially the same as the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 375 may be associated with a first page and a second page. The first page may correspond with bit lines 371 and 373 and the second page may correspond with bit lines 372 and 374. In this case, the first page and the second page may correspond with interdigitated memory cells that share the same word line. When a memory array operation is being performed on the first page (e.g., a programming operation) and the selected word line 376 is biased to the selected word line voltage, one or more other pages also associated with the selected word line 376 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 370 may comprise resistive memory elements without isolating diodes. In one embodiment, the bit lines 372 and 373 may comprise vertical bit lines in a three dimensional memory array comprising comb shaped word lines.

Figure 4A:
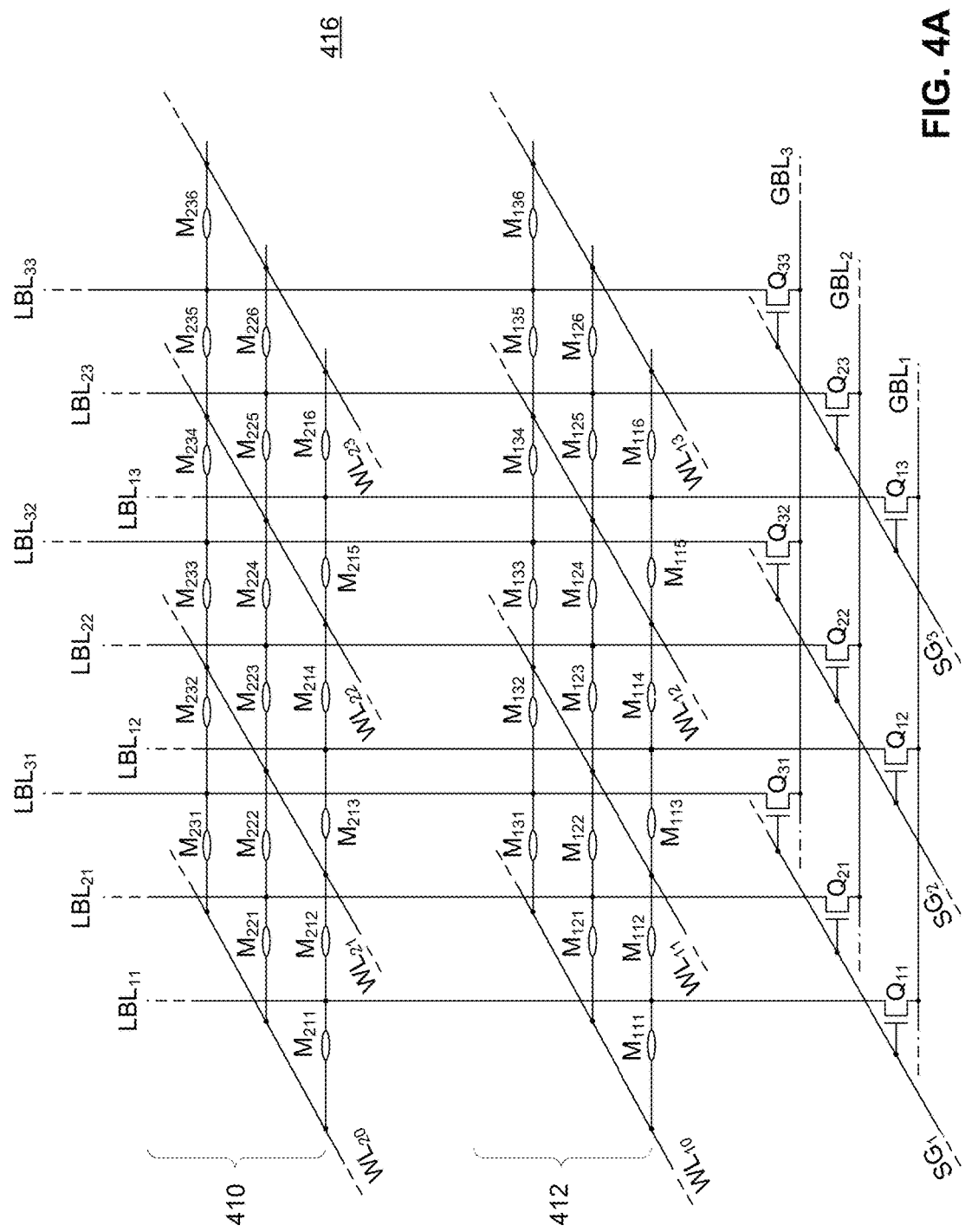
FIGS. 4A-4B depict various embodiments of a portion of a three-dimensional memory array.

FIG. 4A depicts one embodiment of a portion of a monolithic three-dimensional memory array 416 that includes a first memory level 412 positioned below a second memory level 410. Memory array 416 is one example of an implementation for memory array 301 in FIG. 1E. The local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 416, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 4B:
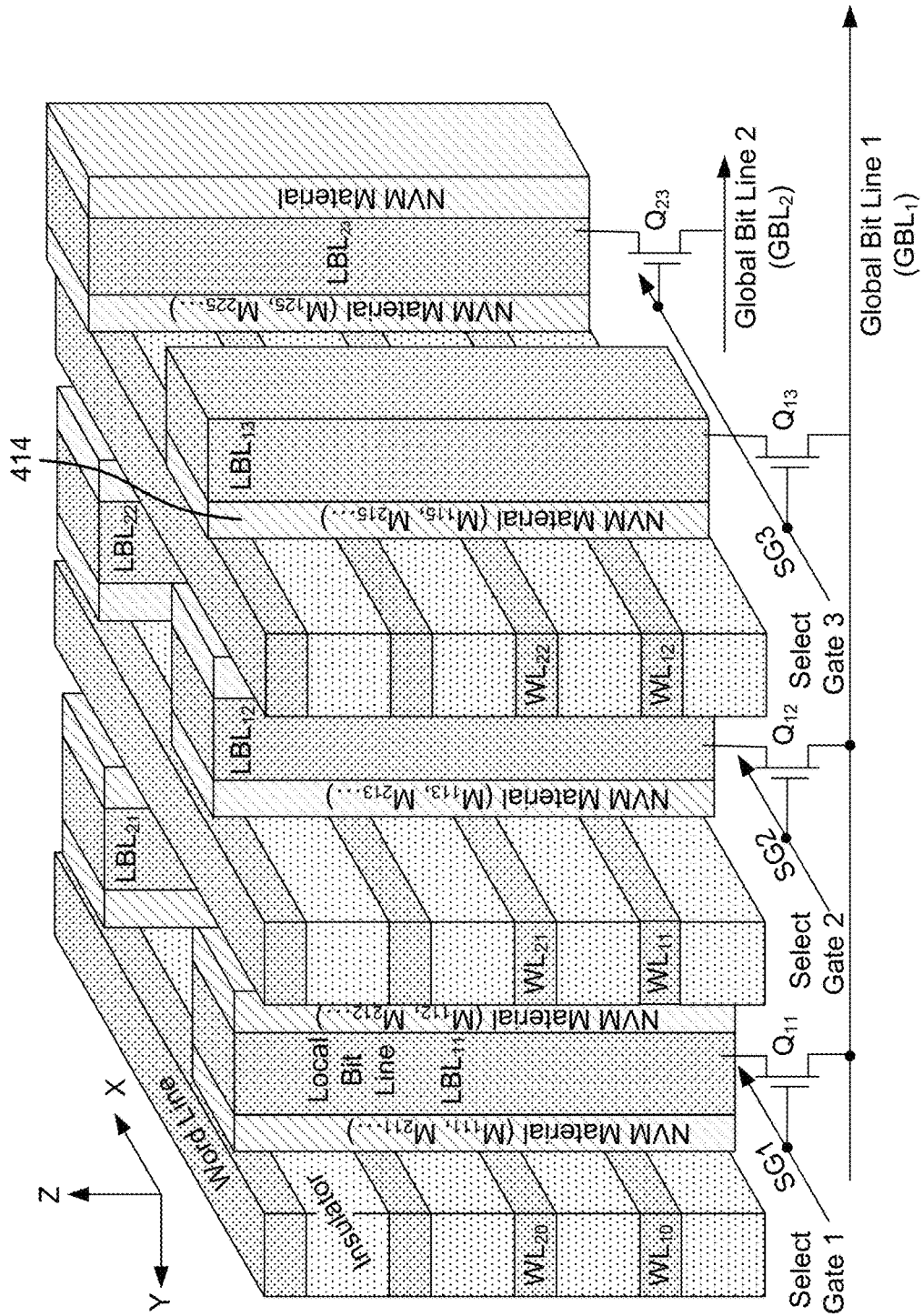

FIG. 4B depicts one embodiment of a portion of a monolithic three-dimensional memory array that includes vertical strips of a non-volatile memory material. The physical structure depicted in FIG. 4B may comprise one implementation for a portion of the monolithic three-dimensional memory array depicted in FIG. 4A. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 414 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical thin-film transistor (TFT).

Figure 5:
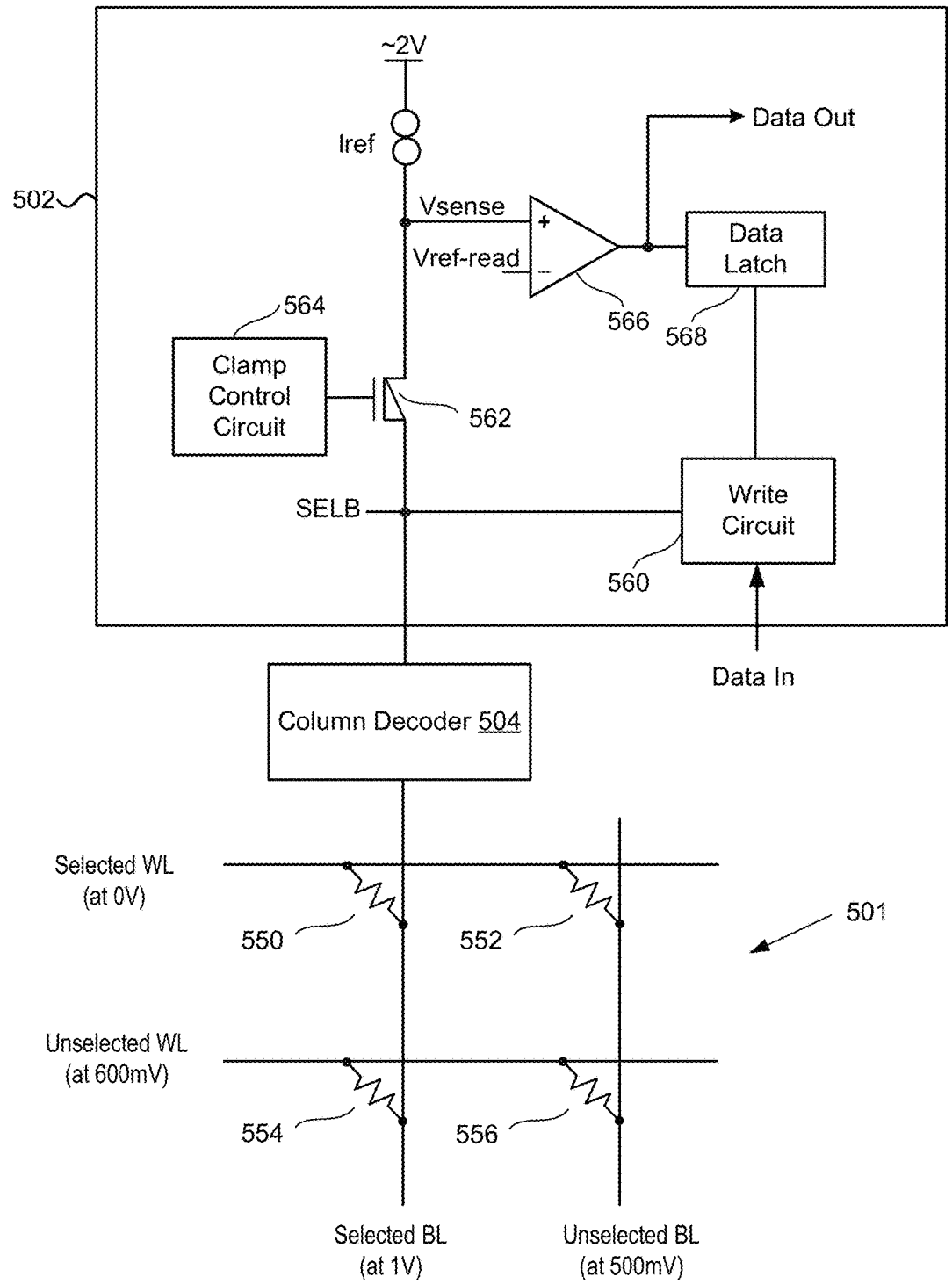
FIG. 5 depicts one embodiment of a read/write circuit.

FIG. 5 depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 2A. In another embodiment, the portion of a memory array 501 may comprise a memory array with bit lines arranged in a vertical direction that is perpendicular to the substrate, such as memory array 416 in FIG. 4A.

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 may be electrically coupled to the selected bit line via column decoder 504. In one embodiment, column decoder 504 may correspond with column decoder 302 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

Figure 6A:
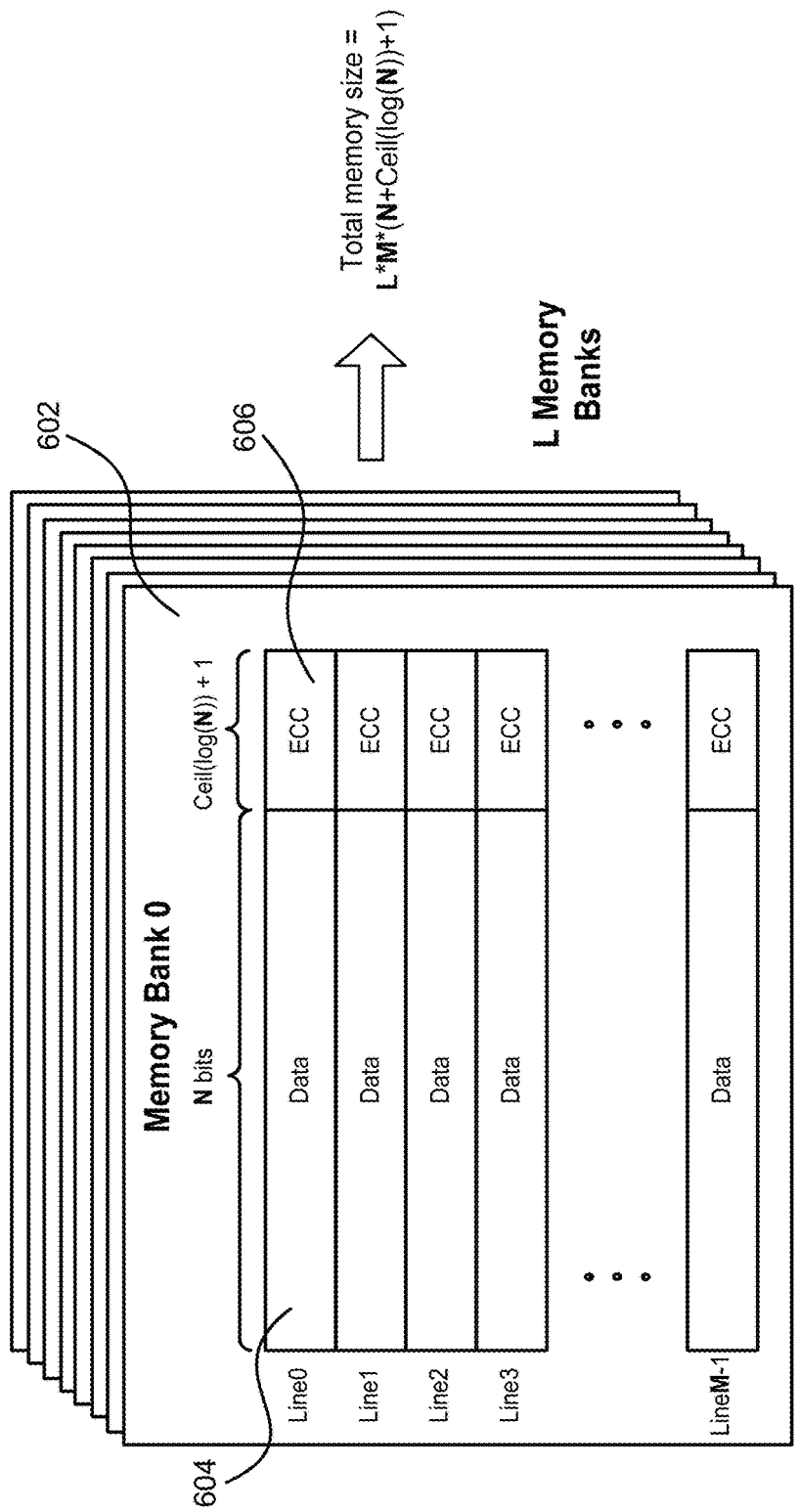
FIG. 6A depicts one embodiment of a plurality of memory banks that store sets of data and error correcting codes for protecting the sets of data.

FIG. 6A depicts one embodiment of a plurality of memory banks that store sets of data and error correcting codes for protecting the sets of data. As depicted, the plurality of memory banks comprises L number of memory banks (e.g., L=16 memory banks). The plurality of memory banks includes a first memory bank 602 that includes M lines (e.g., M=1024 or 2048 lines). Each line may include a data portion 604 and an error correcting code (ECC) portion 606. The error correcting code may protect both the error correcting code itself and the data stored within the data portion 604 from single-bit data errors. The number of data bits within the data portion 604 comprises N data bits (e.g., N=64 data bits) and the number of bits within the ECC portion 606 comprises N+Ceil(log(N))+1 bits. For the implementation depicted in FIG. 6A, a single-bit error occurring to data stored within the data portion 604 may be detected and corrected by reading the parity check bits stored within the ECC portion 606 along with the data stored within the data portion 604 and generating syndrome bits corresponding with the parity check bits in order to detect the single-bit error and determine a bit position for the single-bit error within the data portion 604. The total memory size for the plurality of memory banks depicted in FIG. 6A comprises L*M*(N+Ceil($\log_2$(N))+1).

Figure 6B:
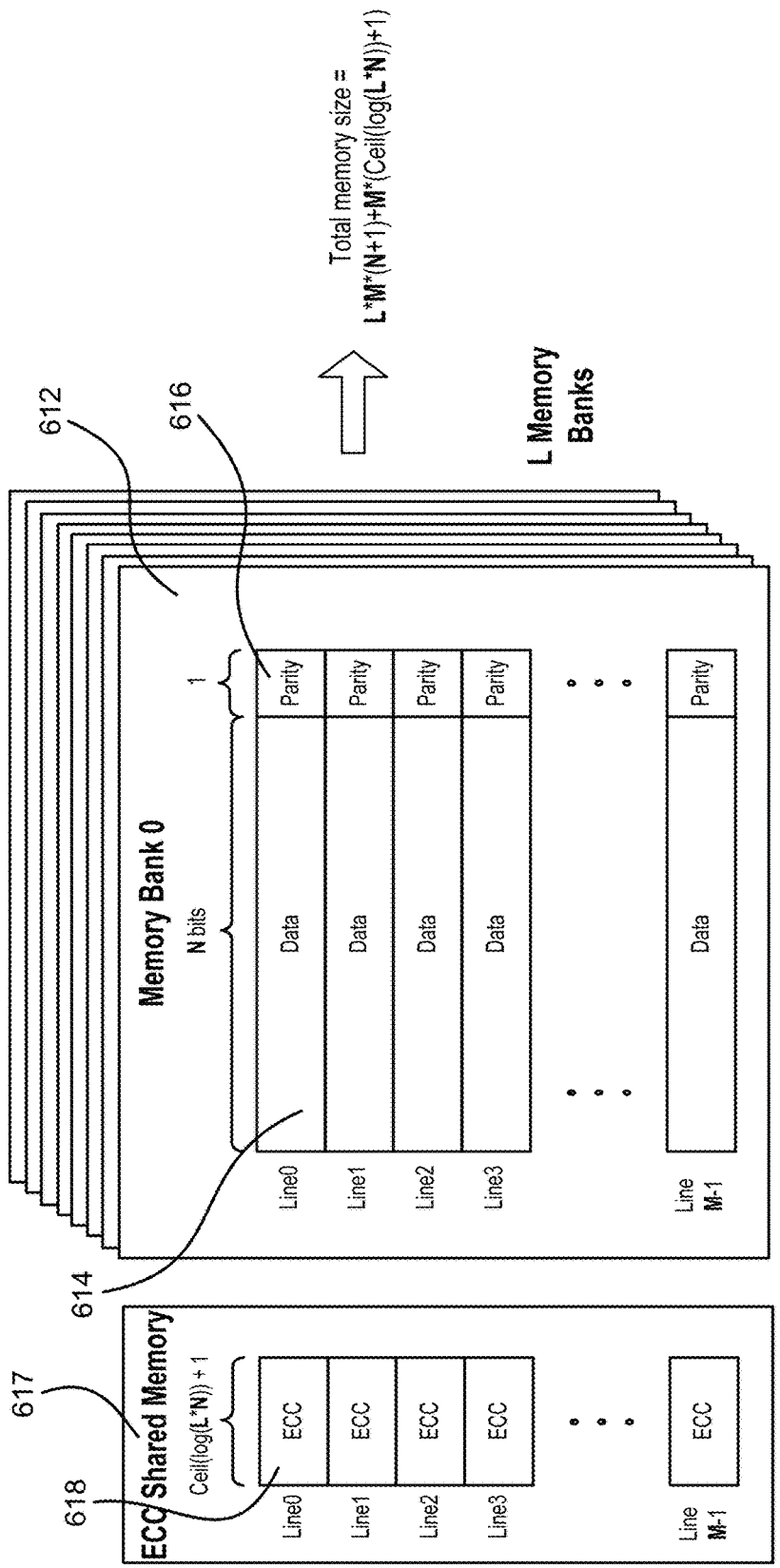
FIG. 6B depicts one embodiment of a dedicated shared memory bank and a plurality of memory banks that store sets of data and error correcting codes for protecting the sets of data.

FIG. 6B depicts one embodiment of a dedicated shared memory bank 617 and a plurality of memory banks that store sets of data and error correcting codes for protecting the sets of data. As depicted, the plurality of memory banks comprises L number of memory banks (e.g., L=16 memory banks). The plurality of memory banks includes a first memory bank 612 that includes M lines (e.g., M=1024 or 2048 lines). Each of the L memory banks may comprise M number of lines and each line of the M lines (e.g., Line0) may extend across the plurality of memory banks. Each line within the first memory bank 612 may include a data portion 614 and a local parity bit 616. The number of data bits within the data portion 614 comprises N data bits (e.g., N=64 data bits) and the number of bits for the local parity bit 616 is one bit. The local parity bit 616 may be set such that the number of logic "1"s within the data portion 614 is even (or odd in the case of an odd parity bit). The dedicated shared memory bank 617 includes M lines corresponding with the number of lines (or rows) within the plurality of memory banks. Each line within the dedicated shared memory bank 617 may include an ECC portion 618 comprising ceil($\log_2$(L*N))+1 number of bits. The total memory size for the plurality of memory banks and the dedicated shared memory bank depicted in FIG. 6B comprises L*M*(N+1)+M*(Ceil($\log_2$(L*N))+1). Thus, both the total memory size for the plurality of memory banks and the memory size of each memory bank depicted in FIG. 6B may be smaller than the implementation depicted in FIG. 6A.

Figure 6C:
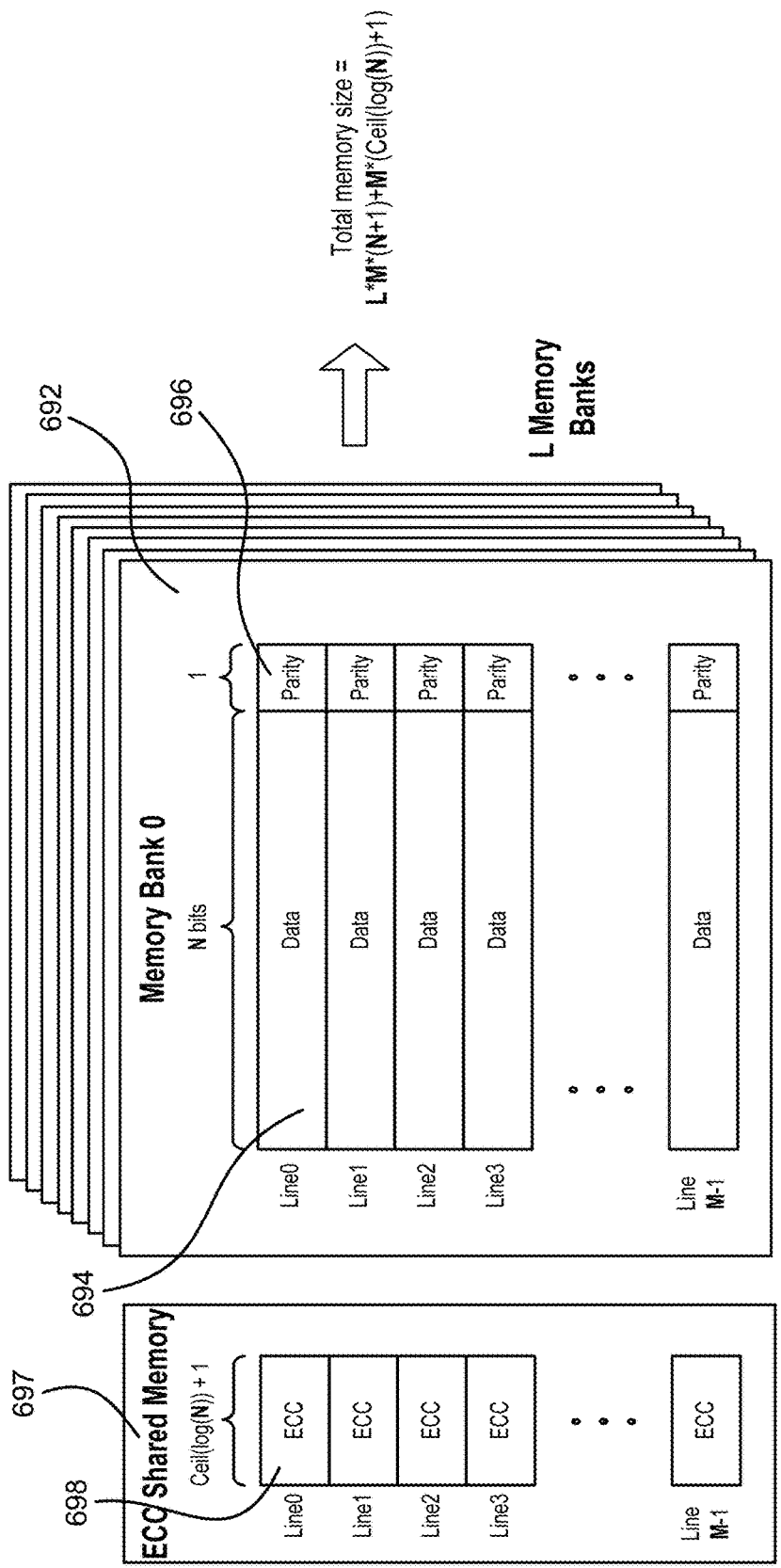
FIG. 6C depicts another embodiment of a dedicated shared memory bank and a plurality of memory banks that store sets of data and error correcting codes for protecting the sets of data.

FIG. 6C depicts one embodiment of a dedicated shared memory bank 697 and a plurality of memory banks that store sets of data and error correcting codes for protecting the sets of data. As depicted, the plurality of memory banks comprises L number of memory banks (e.g., L=32 memory banks). The plurality of memory banks includes a first memory bank 692 that includes M lines (e.g., M=1024 or 512 lines). Each of the L memory banks may comprise M number of lines and each line of the M lines (e.g., Line1) may extend across the plurality of memory banks. Each line within the first memory bank 692 may include a data portion 694 and a local parity bit 696. The number of data bits within the data portion 694 comprises N data bits (e.g., N=32 data bits) and the number of bits for the local parity bit 696 is one bit. The local parity bit 696 may be set such that the number of logic "1"s within the data portion 694 is even (or odd in the case of an odd parity bit). The shared memory bank 697 includes M lines corresponding with the number of lines (or rows) within the plurality of memory banks. Each line within the dedicated shared memory bank 697 may include an ECC portion 698 comprising ceil($\log_2(N)$)+1 number of bits. The total memory size for the plurality of memory banks and the dedicated shared memory bank depicted in FIG. 6C comprises L*M*(N+1)+M*(Ceil($\log_2(N)$)+1).

In one embodiment, for each line within a memory bank, a local Hamming parity of ceil($\log_2(N)$)+1 bits may be computed. For a particular line across L memory banks, the L local Hamming parities may be used for computing the A'th shared parity to be stored in the shared memory bank 697. The A'th shared parity may be computed by XORing the L local Hamming parities of ceil($\log_2(N)$)+1 bits. In this case, the size of the shared parity per memory line is ceil($\log_2(N)$)+1 bits (which is less than the ceil($\log_2$(L*N))+1 bits that appear in FIG. 6B). If a bit flip or a bit error is detected in one of the memory lines across the L memory banks (e.g., based on a discrepancy with a single local parity bit, such as the local parity bit 696), then the bit error may be detected and corrected by reading all the other L-1 A'th lines, computing for each one of the L-1 A'th lines its local Hamming parity, and DEXORing the L-1 A'th local Hamming parities from the A'th shared Hamming parity stored within the shared memory bank 697 in order to generate the local Hamming parity of the A'th line of the bank in which the bit error was detected. Using the computed local Hamming parity, the single bit error or bit flip within the A'th line of the memory bank may be detected and flipped (e.g., from a "0" to a "1" or from a "1" to a "0").

Figure 6D:
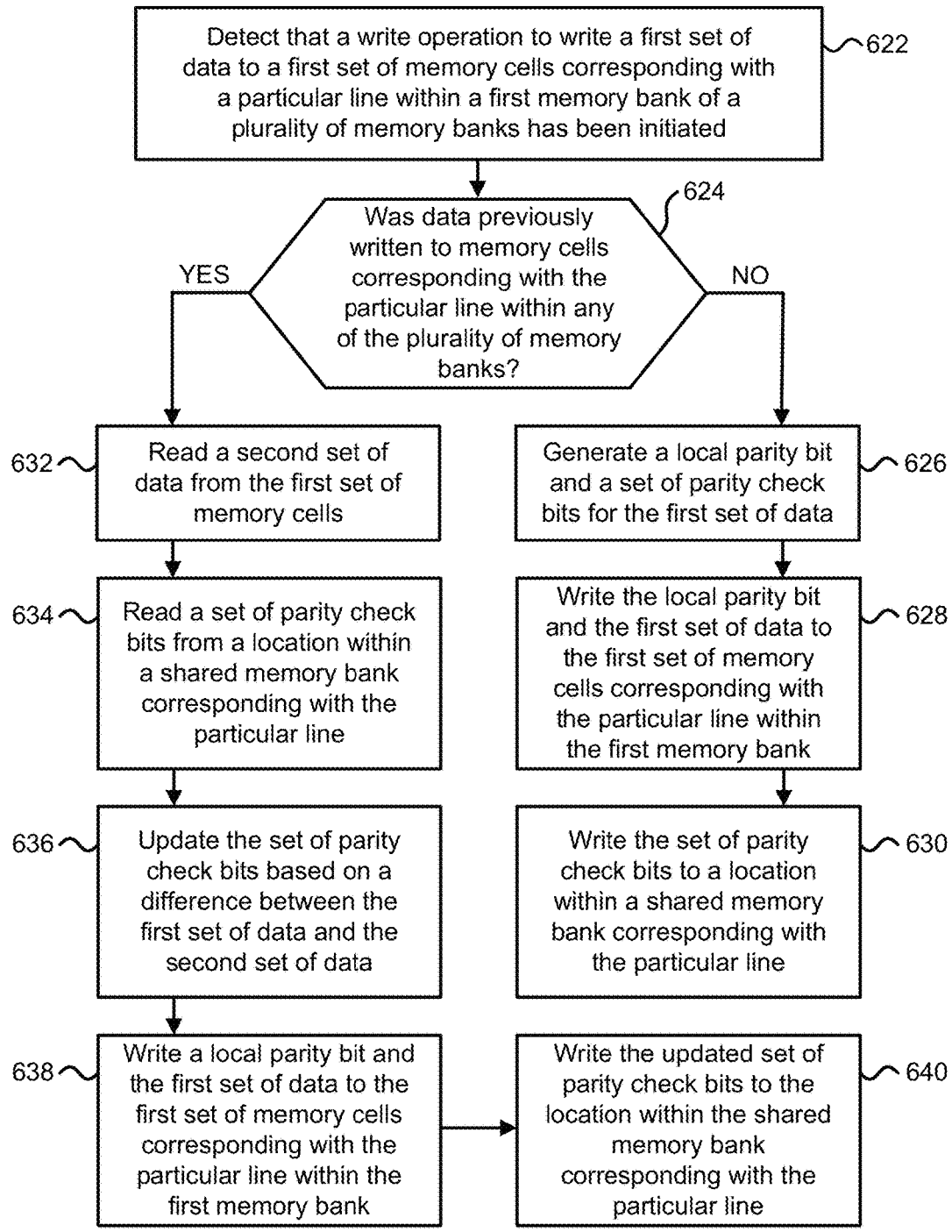
FIG. 6D is a flowchart describing one embodiment of a process for writing data to a first memory bank of a plurality of memory banks.

FIG. 6D is a flowchart describing one embodiment of a process for writing data to a first memory bank of a plurality of memory banks. In one embodiment, the process of FIG. 6D may be performed by a memory chip controller or a controller in communication with a plurality of memory banks, such as controller 108 in FIG. 1A.

In step 622, it is detected that a write operation to write a first set of data to a first set of memory cells corresponding with a particular line within a first memory bank of a plurality of memory banks has been initiated. The plurality of memory banks may correspond with memory banks 107 in FIG. 1A. Each memory bank of the plurality of memory banks may comprise an SRAM with a plurality of lines including the particular line (e.g., corresponding with a particular memory row). The first set of memory cells may comprise 64 memory cells or 32 memory cells. The first set of memory cells may comprise SRAM cells, DRAM cells, or Flash-based memory cells. In step 624, it is determined whether data was previously written to memory cells corresponding with the particular line within any of the plurality of memory banks. In one example, the plurality of memory banks may comprise 16 memory banks and the particular line may correspond with the top line (e.g., Line0 in FIG. 6B) or the top row within each of the plurality of memory banks. In the case that the write operation comprises the first write operation to the particular line since a previous resetting operation or line erase operation that set the data within the particular line to "0," then a read before write operation to read additional data from the plurality of memory banks may be skipped.

If it is determined that data was not previously written to the memory cells corresponding with the particular line within any of the plurality of memory banks, then step 626 is performed. In step 626, a local parity bit and a set of parity check bits for the first set of data is generated. The local parity bit may be generated by XORing each bit of the first set of data. The set of parity check bits may be generated via application of a single-error correcting Hamming code to the first set of data. In step 628, the local parity bit and the first set of data are written to the first set of memory cells corresponding with the particular line within the first memory bank. In step 630, the set of parity check bits is written to a location within a shared memory bank corresponding with the particular line. In one example, the local parity bit may correspond with the local parity bit 616 in FIG. 6B and the set of parity check bits may correspond with the ECC portion 618 of the dedicated shared memory bank 617 in FIG. 6B.

Otherwise, if it is determined that data was previously written to the memory cells corresponding with the particular line prior to the write operation, then step 632 is performed. In this case, the set of parity check bits may have been generated using data stored in other memory banks of the plurality of memory banks different from the first memory bank. In step 632, a second set of data is read from the first set of memory cells. The second set of data may comprise data that was previously written to the particular line within the first memory bank (e.g., previously written data that is to be overwritten by the first set of data). If the memory cells corresponding with the particular line within the first memory bank have not been previously written to, then step 632 may be skipped. In step 634, a set of parity check bits is read from a location within a shared memory bank corresponding with the particular line (e.g., Line0 in FIG. 6B). The set of parity check bits may correspond with a previously written single-error correcting code for correcting a single-bit error within data stored using the memory cells corresponding with the particular line across all of the plurality of memory banks. In one example, the plurality of memory banks may comprise 16 memory banks with 64-bit data widths and the set of parity check bits may protect the 1024 bits corresponding with a particular line across all of the plurality of memory banks from single-bit errors.

In step 636, the set of parity check bits may be updated based on data differences between the first set of data and the second set of data. In one example, a first equation for generating a first parity check bit of the set of parity check bits may be acquired and one or more bit positions within the second set of data may be identified using the first equation. The data differences between the first set of data to be written and the second set of data that was previously stored for the one or more bit positions may be used to generate an updated first parity check bit. In one example, if the one or more bit positions correspond with bit 32 and bit 64, then bit 32 of the first set of data may be compared with bit 32 of the second set of data and bit 64 of the first set of data may be compared with bit 64 of the second set of data. If the data for bit position 32 is different and the data for bit position 64 is the same, then the first parity check bit needs to be changed or flipped (e.g., from a "0" to a "1" or a "1" to a "0"). However, if both the data for bit position 32 is different and the data for bit position 64 is different, then the first parity check bit may stay the same and not be changed or flipped.

In another example, for each parity check bit of the set of parity check bits, the data corresponding with the bit positions within the second set of data used to generate the parity check bit may be XOR'd with the parity check bit and then XOR'd with the data corresponding with the same bit positions within the first set of data. In one example, if the bit positions within the second set of data used to generate a first parity check bit of the set of parity check bits correspond with bit positions 16 and 32, then the first parity check bit may be XOR'd with the data bits within the second set of data at bit positions 16 and 32 and then the resulting parity may be XOR'd with the data bits within the first set of data at bit positions 16 and 32. In one case, if there is no change in the data for bit positions 16 and 32 between the second set of data and the first set of data, then the first parity check bit will remain the same and not be altered. In another case, if there is no change in the data for bit position 16 between the second set of data and the first set of data but there is a change in the data for bit position 32 between the second set of data and the first set of data, then the first parity check bit will be changed or flipped to account for the data changes in the first set of data.

In step 638, a local parity bit and the first set of data are written to the first set of memory cells corresponding with the particular line within the first memory bank. The local parity bit may be generated by XORing each bit within the first set of data. In step 640, the updated set of parity check bits is written to the location within the shared memory bank corresponding with the particular line. The first set of memory cells may correspond with the data portion 614 in FIG. 6B, the local parity bit may correspond with the local parity bit 616 in FIG. 6B, and the updated set of parity check bits may be written to the ECC portion 618 of the dedicated shared memory bank 617 in FIG. 6B.

In some cases, a memory controller or control circuitry for managing the reading and writing of data to a plurality of memory banks, such as controller 108 in FIG. 1A, may comprise a representative example of means for acquiring a first set of data to be written to memory cells corresponding with a particular line within a first memory bank of the plurality of memory banks and means for detecting that other data was previously written to memory cells corresponding with the particular line within a second memory bank of the plurality of memory banks. The dedicated shared memory bank 617 in FIG. 6B may comprise a representative example of means for storing a set of parity check bits.

Figure 6E:
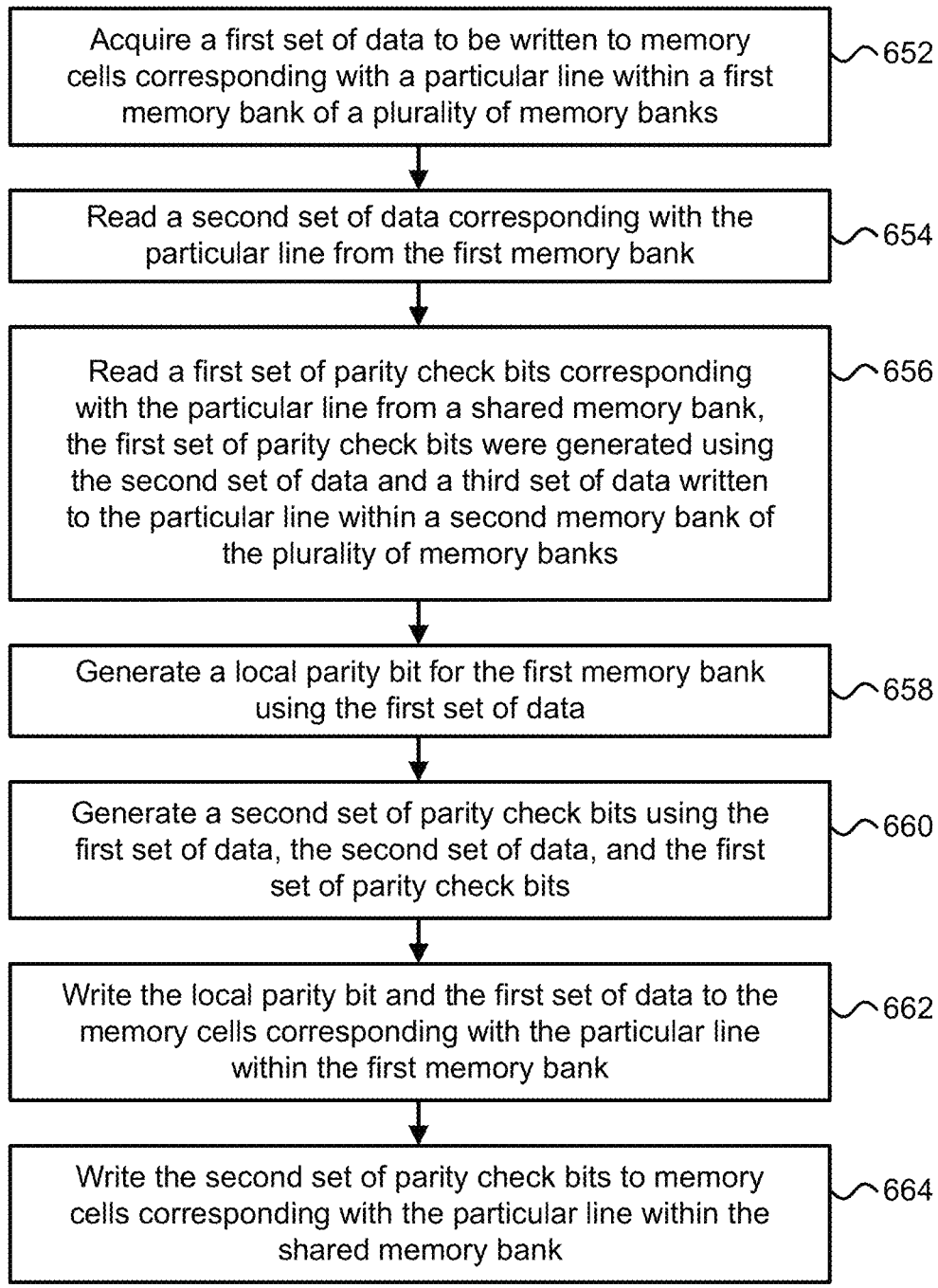
FIG. 6E is a flowchart describing an alternative embodiment of a process for writing data to a first memory bank of a plurality of memory banks.

FIG. 6E is a flowchart describing an alternative embodiment of a process for writing data to a first memory bank of a plurality of memory banks. In one embodiment, the process of FIG. 6E may be performed by a memory chip controller or a controller in communication with a plurality of memory banks, such as controller 108 in FIG. 1A.

In step 652, a first set of data to be written to memory cells corresponding with a particular line within a first memory bank of a plurality of memory banks is acquired. In step 654, a second set of data corresponding with the particular line is read from the first memory bank. The first set of data may comprise data to be written to the memory cells corresponding with the particular line within the first memory bank and the second set of data may comprise data that was previously written to the memory cells corresponding with the particular line within the first memory bank. In step 656, a first set of parity check bits corresponding with the particular line is read from a shared memory bank. The first set of parity check bits may have been generated using the second set of data and a third set of data written to the particular line within a second memory bank of the plurality of memory banks different from the first memory bank. The first set of parity check bits may have been generated using data from one or more memory banks of the plurality of memory banks different from the first memory bank. In one example, the first set of parity check bits may correspond with a single-error correcting code for correcting single-bit errors across a particular line or a particular row across the plurality of memory banks (e.g., all data written to row 12 across the plurality of memory banks).

In step 658, a local parity bit for the first set of data is generated using the first set of data. The local parity bit may be generated by XORing each bit within the first set of data. The local parity bit may indicate whether the number of logic "1"s within the first set of data is even or odd. In step 660, a second set of parity check bits is generated using the first set of data, the second set of data, and the first set of parity check bits. In one example, the second set of parity check bits may be generated by updating the first set of parity check bits to reflect the data differences between the first set of data to be written to the particular line of the first memory bank and the second set of data that was previously written to the particular line of the first memory bank. In step 662, the local parity bit and the first set of data is written to the memory cells corresponding with the particular line within the first memory bank. In step 664, the second set of parity check bits is written to memory cells corresponding with the particular line within the shared memory bank.

Figure 6F:
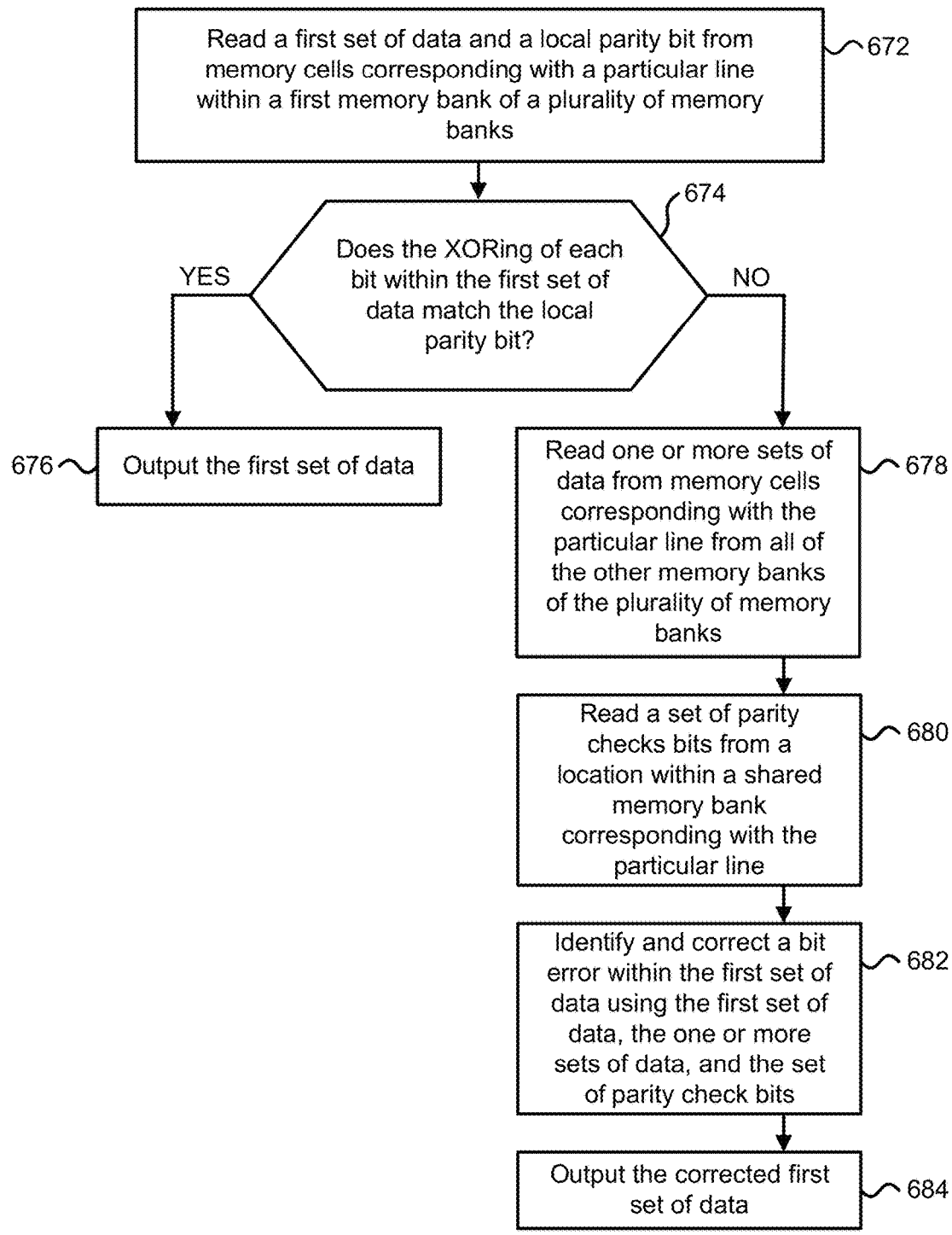
FIG. 6F is a flowchart describing one embodiment of a process for reading data from a first memory bank of a plurality of memory banks.

FIG. 6F is a flowchart describing one embodiment of a process for reading data from a first memory bank of a plurality of memory banks. In one embodiment, the process of FIG. 6F may be performed by a memory chip controller or a controller in communication with a plurality of memory banks, such as controller 108 in FIG. 1A.

In step 672, a first set of data and a local parity bit are read from memory cells corresponding with a particular line within a first memory bank of a plurality of memory banks. The first set of data may be read from the data portion 614 in FIG. 6B and the local parity bit may be read from the local parity bit 616 in FIG. 6B. In step 674, it is determined whether there has been a single-bit error within the first set of data. In one example, it may be determined that there has been a single-bit error within the first set of data by XORing each bit within the first set of data and comparing the result with the local parity bit. If there is a mismatch between the local parity bit and the resulting XORing of each bit within the first set of data, then a single-bit error has been detected. If it is determined that the first set of data does not include a single-bit error, then step 676 is performed. In step 676, the first set of data is outputted. The first set of data may be outputted from a controller, such as controller 108 in FIG. 1A, by transferring the first set of data to a host. If it is determined that the first set of data does include a single-bit error, then step 678 is performed. In step 678, one or more sets of data are read from memory cells corresponding with the particular line from all of the other memory banks of the plurality of memory banks. In one example, if the total number of memory banks comprises 16 memory banks with 64-bit data widths, then the one or more sets of data may comprise 15 sets of 64 bits of data corresponding with the 15 memory banks other than the first memory bank within the plurality of memory banks.

In step 680, a set of parity check bits is read from a location within a shared memory bank corresponding with the particular line. In step 682, a bit error within the first set of data is identified and corrected using the first set of data, the one or more sets of data, and the set of parity check bits. In this case, once the set of parity check bits and the entire data set comprising the first set of data and the one or more sets of data have been acquired, then the single-bit error within the first set of data may be identified and corrected via syndrome decoding. In step 684, the corrected first set of data is outputted. In one example, the corrected first set of data may be transferred to a host, such as host 106 in FIG. 1A, or to a memory chip, such as memory chip 102 in FIG. 1A.

Figure 7A:
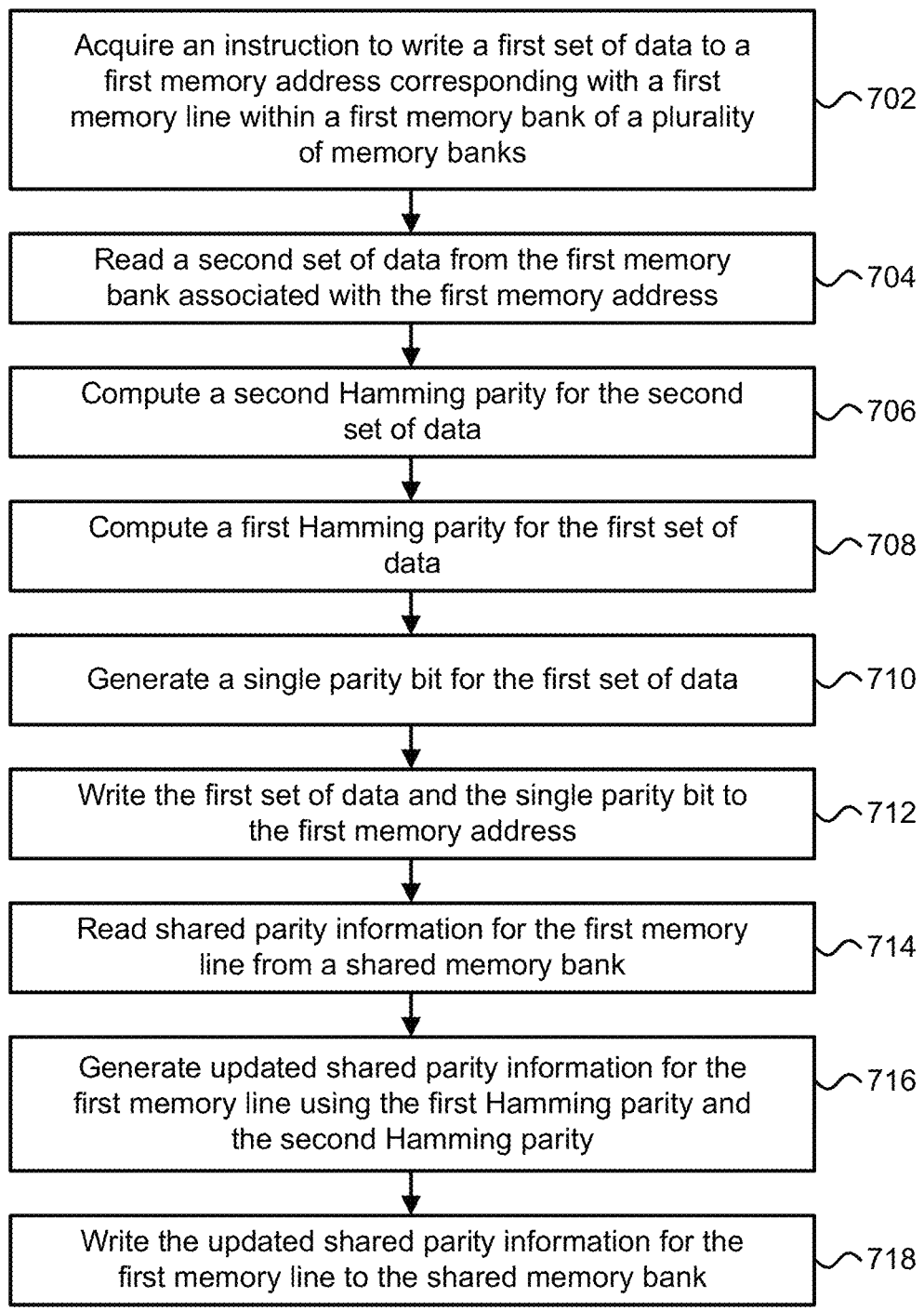
FIG. 7A is a flowchart describing one embodiment of a process for writing data to a first memory bank of a plurality of memory banks.

FIG. 7A is a flowchart describing one embodiment of a process for writing data to a first memory bank of a plurality of memory banks. In one embodiment, the process of FIG. 7A may be performed by a memory chip controller or a controller in communication with a plurality of memory banks, such as controller 108 in FIG. 1A.

In step 702, an instruction to write a first set of data to a first memory address corresponding with a first memory line within a first memory bank of a plurality of memory banks is acquired. The first set of data may comprise new data to be written to the first memory address. The first memory bank may correspond with memory bank 0 in FIG. 6C. In step 704, a second set of data is read from the first memory bank associated with the first memory address. The second set of data may comprise data that was previously written to the first memory address. In step 706, a second Hamming parity for the second set of data is computed. In step 708, a first Hamming parity for the first set of data is computed. In the case that the first set of data and the second set of data each comprise N bits of data, then the first Hamming parity and the second Hamming parity may each comprise ceil (log$_2$(N))+1 bits of data.

In step 710, a single parity bit is generated for the first set of data. The single parity bit may be generated by XORing each of the bits within the first set of data. The single parity bit may correspond with the local parity bit 696 in FIG. 6C. In step 712, the first set of data and the single parity bit are written to the first memory address. In step 714, shared parity information for the first memory line is read from a shared memory bank. The shared memory bank may correspond with shared memory bank 697 in FIG. 6C. In step 716, updated shared parity information for the first memory line is generated using the first Hamming parity and the second Hamming parity. The updated shared parity information may be generated by XORing the shared parity information acquired in step 714 with the first Hamming parity and the second Hamming parity. In step 718, the updated shared parity information for the first memory line is written to the shared memory bank.

Figure 7B:
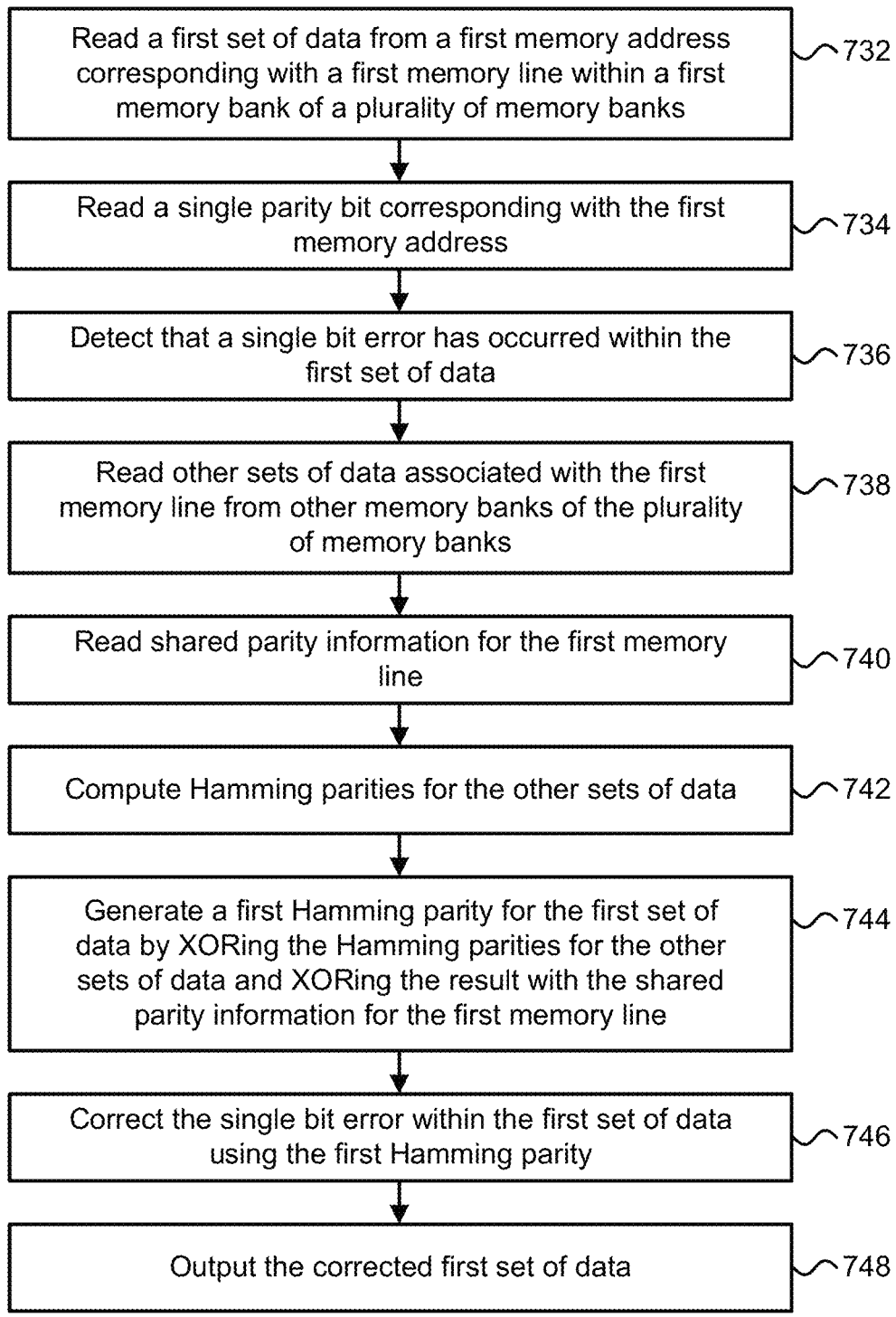
FIG. 7B is a flowchart describing one embodiment of a process for reading data from a first memory bank of a plurality of memory banks.

FIG. 7B is a flowchart describing one embodiment of a process for reading data from a first memory bank of a plurality of memory banks. In one embodiment, the process of FIG. 7B may be performed by a memory chip controller or a controller in communication with a plurality of memory banks, such as controller 108 in FIG. 1A.

In step 732, a first set of data is read from a first memory address corresponding with a first memory line within a first memory bank of a plurality of memory banks. In step 734, a single parity bit is read corresponding with the first memory address. The first set of data may correspond with the data portion 694 in FIG. 6C and the single parity bit may correspond with the local parity bit 696 in FIG. 6C. In step 736, it is detected that a single bit error has occurred within the first set of data. It may be detected that the single bit error has occurred within the first set of data by XORing the data within the first set of data and comparing the result with the single parity bit read in step 734. If the single parity bit does not match the XORing of the first set of data, then it may be detected that the single bit error has occurred within the first set of data.

In step 738, in response to detecting the single bit error in step 736, other sets of data associated with the first memory line may be read from other memory banks of the plurality of memory banks. In one example, the other memory banks may comprise L-1 total memory banks and the plurality of memory banks may comprise L total memory banks. In step 740, shared parity information for the first memory line may be read. The shared parity information may be read from a shared memory bank, such as the shared memory bank 697 in FIG. 6C. The shared parity information may correspond with the ECC portion 698 in FIG. 6C. In step 742, Hamming parities are computed or generated for the other sets of data. In step 744, a first Hamming parity for the first set of data is generated by XORing the Hamming parities for the other sets of data and XORing the result with the shared parity information for the first memory line. In the case that the first set of data comprises N bits of data, then the first Hamming parity may comprise ceil(log$_2$(N))+1 bits of data. In step 746, the single bit error is detected and corrected within the first set of data using the first Hamming parity. In step 748, the corrected first set of data is output.

One embodiment of the disclosed technology includes a plurality of memory banks (e.g., 16 SRAM memory banks), a shared memory bank, and one or more control circuits. The plurality of memory banks includes a first memory bank and a second memory bank. The one or more control circuits configured to acquire a first set of data to be written to memory cells corresponding with a particular line within the first memory bank and detect that other data was previously written to memory cells corresponding with the particular line within the second memory bank. The one or more control circuits configured to read a set of parity check bits from a location within the shared memory bank corresponding with the particular line in response to detection that the other data was previously written to memory cells corresponding with the particular line within the second memory bank. The one or more control circuits configured to update the set of parity check bits based on data differences between the first set of data and a second set of data previously written to the memory cells corresponding with the particular line within the first memory bank and generate a local parity bit using the first set of data. The one or more control circuits configured to write the local parity bit and the first set of data to the first set of the memory cells corresponding with the particular line within the first memory bank and write the updated set of parity check bits to the location within the shared memory bank corresponding with the particular line.

One embodiment of the disclosed technology includes acquiring a first set of data to be written to memory cells corresponding with a particular line within a first memory bank of a plurality of memory banks, detecting that a third set of data was previously written to memory cells corresponding with the particular line within a second memory bank of the plurality of memory banks, reading a first set of parity check bits from a location within a shared memory bank corresponding with the particular line in response to detecting that the third set of data was previously written to the memory cells corresponding with the particular line within the second memory bank, reading a second set of data previously written to the memory cells corresponding with the particular line within the first memory bank, updating the first set of parity check bits based on data differences between the first set of data and the second set of data previously written to the memory cells corresponding with the particular line within the first memory bank, generating a local parity bit using the first set of data, writing the local parity bit and the first set of data to the memory cells corresponding with the particular line within the first memory bank, and writing the updated set of parity check bits to the location within the shared memory bank corresponding with the particular line.

One embodiment of the disclosed technology includes a plurality of memory banks including a first memory bank and a second memory bank, means for storing a set of parity check bits, means for detecting that a third set of data was written to memory cells corresponding with a particular line within the second memory bank, and a memory controller (or memory bank controller). The memory controller configured to generate the set of parity check bits using the third set of data and acquire a first set of data to be written to memory cells corresponding with the particular line within the first memory bank. The memory controller configured to update the set of parity check bits based on a data difference between the first set of data and a second set of data that was previously written to the memory cells corresponding with the particular line within the first memory bank. The memory controller configured to generate a local parity bit using the first set of data and write the local parity bit to the memory cells corresponding with the particular line within the first memory bank. The memory controller configured to write the first set of data to the memory cells corresponding with the particular line within the first memory bank and write the updated set of parity check bits to the means for storing the set of parity check bits.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a plurality of memory banks including a first memory bank and a second memory bank;
a shared memory bank configured to store a set of shared parity check bits for data stored within the plurality of memory banks; and
one or more control circuits configured to acquire a first set of data to be written to memory cells corresponding with a particular line within the first memory bank, the one or more control circuits configured to detect that other data was previously written to memory cells corresponding with the particular line within the second memory bank and read the set of shared parity check bits from a location within the shared memory bank corresponding with the particular line in response to detection that the other data was previously written to memory cells corresponding with the particular line within the second memory bank different from the first memory bank, the one or more control circuits configured to update the set of shared parity check bits based on data differences between the first set of data and a second set of data previously written to the memory cells corresponding with the particular line within the first memory bank and generate a local parity bit using the first set of data, the one or more control circuits configured to write the local parity bit and the first set of data to the memory cells corresponding with the particular line within the first memory bank and write the updated set of shared parity check bits to the location within the shared memory bank corresponding with the particular line.

2. The apparatus of claim 1, wherein:
the set of shared parity check bits were generated using the second set of data and the other data that was stored using the memory cells corresponding with the particular line within the second memory bank prior to being updated.

3. The apparatus of claim 1, wherein:
the set of shared parity check bits corresponds with a single-error correcting code.

4. The apparatus of claim 1, wherein:
the set of shared parity check bits corresponds with a Hamming code.

5. The apparatus of claim 1, wherein:
the set of shared parity check bits corresponds with a single-error correcting and double-error detecting code.

6. The apparatus of claim 1, wherein:
the plurality of memory banks is arranged on a first integrated circuit; and
the shared memory bank is arranged on the first integrated circuit.

7. The apparatus of claim 6, wherein:
the first integrated circuit includes a non-volatile memory that is monolithically formed in one or more physical levels of memory cells having active areas disposed above a silicon substrate.

8. The apparatus of claim 1, wherein:
the plurality of memory banks is arranged on a first integrated circuit; and
the shared memory bank is arranged on a second integrated circuit different from the first integrated circuit.

9. The apparatus of claim 1, wherein:
the first memory bank comprises an SRAM memory bank.

10. The apparatus of claim 1, wherein:
the local parity bit comprises an even parity bit.

11. A method, comprising:
acquiring a first set of data to be written to memory cells corresponding with a particular line within a first memory bank of a plurality of memory banks;
detecting that a third set of data was previously written to memory cells corresponding with the particular line within a second memory bank of the plurality of memory banks;
reading a set of shared parity check bits from a location within a shared memory bank corresponding with the particular line that extends across the plurality of memory banks in response to detecting that the third set of data was previously written to the memory cells corresponding with the particular line within the second memory bank different from the first memory bank;
reading a second set of data previously written to the memory cells corresponding with the particular line within the first memory bank;
updating the set of shared parity check bits based on data differences between the first set of data and the second set of data previously written to the memory cells corresponding with the particular line within the first memory bank;
generating a local parity bit using the first set of data;
writing the local parity bit and the first set of data to the memory cells corresponding with the particular line within the first memory bank; and
writing the updated set of shared parity check bits to the location within the shared memory bank corresponding with the particular line.

12. The method of claim 11, further comprising:
generating the set of shared parity check bits using the second set of data and the third set of data prior to acquiring the first set of data to be written to the memory cells corresponding with the particular line within the first memory bank.

13. The method of claim 11, wherein:
the set of shared parity check bits corresponds with a single-error correcting code.

14. The method of claim 11, wherein:
the set of shared parity check bits corresponds with a Hamming code.

15. The method of claim 11, wherein:
the set of shared parity check bits corresponds with a single-error correcting and double-error detecting code.

16. The method of claim 11, wherein:
the plurality of memory banks is arranged on a first integrated circuit; and
the shared memory bank is arranged on the first integrated circuit.

17. The method of claim 11, wherein:
the plurality of memory banks is arranged on a first integrated circuit; and
the shared memory bank is arranged on a second integrated circuit different from the first integrated circuit.

18. The method of claim 11, wherein:
the first memory bank comprises an SRAM memory bank.

19. The method of claim 11, wherein:
the local parity bit comprises an even parity bit.

20. An apparatus, comprising:
a plurality of memory banks including a first memory bank and a second memory bank;
means for storing a set of shared parity check bits within a shared memory bank at a location within the shared memory bank corresponding with a particular line that extends across the plurality of memory banks;
means for detecting that a third set of data was written to memory cells corresponding with the particular line within the second memory bank; and
a memory controller configured to generate the set of shared parity check bits using the third set of data and acquire a first set of data to be written to memory cells corresponding with the particular line within the first memory bank, the memory controller configured to read the set of shared parity check bits from the location within the shared memory bank corresponding with the particular line in response to detection that the third set of data was previously written to the memory cells corresponding with the particular line within the second memory bank different from the first memory bank and update the set of shared parity check bits based on a data difference between the first set of data and a second set of data that was previously written to the memory cells corresponding with the particular line within the first memory bank, the memory controller configured to generate a local parity bit using the first set of data and write the local parity bit to the memory cells corresponding with the particular line within the first memory bank, the memory controller configured to write the first set of data to the memory cells corresponding with the particular line within the first memory bank and write the updated set of shared parity check bits to the means for storing the set of shared parity check bits.

* * * * *